(12) United States Patent
Noda

(10) Patent No.: US 7,138,696 B2
(45) Date of Patent: Nov. 21, 2006

(54) IMAGE PICKUP APPARATUS, RADIATION IMAGE PICKUP APPARATUS AND RADIATION IMAGE PICKUP SYSTEM

(75) Inventor: Tomoyuki Noda, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 734 days.

(21) Appl. No.: 10/270,651

(22) Filed: Oct. 16, 2002

(65) Prior Publication Data

US 2003/0076433 A1    Apr. 24, 2003

(30) Foreign Application Priority Data

Oct. 19, 2001    (JP)    ............................. 2001-322396

(51) Int. Cl.
*H01L 31/00*    (2006.01)
(52) U.S. Cl. ...................... 257/443; 257/222; 257/290
(58) Field of Classification Search ................ 257/443, 257/222, 290
See application file for complete search history.

(56) References Cited

U.S. PATENT DOCUMENTS 5,336,879 A    8/1994    Sauer ...................... 250/208.1
6,541,805 B1*  4/2003    Suzuki ........................ 257/232
2002/0024606 A1  2/2002  Yuki et al. .................. 348/302

* cited by examiner

*Primary Examiner*—Andy Huynh
*Assistant Examiner*—Thinh T Nguyen
(74) *Attorney, Agent, or Firm*—Fitzpatrick, Cella, Harper & Scinto

(57) ABSTRACT

An image pickup apparatus includes plural light receiving areas arranged two-dimensionally and a vertical scanning circuit composed of plural unit circuit stages arranged in the vertical direction and a horizontal scanning circuit composed of plural unit circuit stages arranged in the horizontal direction for selecting and reading the plural light receiving areas in succession and in which the vertical scanning circuit and the horizontal scanning circuit are arranged in spaces between the light receiving areas. A crossing area of the vertical scanning circuit and the horizontal scanning circuit, in a space between the light receiving areas, is divided into two areas, and at least a unit circuit of the horizontal scanning circuit is provided in one of the two areas while at least a unit circuit of the vertical scanning circuit is provided in the other of the two areas.

5 Claims, 14 Drawing Sheets

IMAGE PICKUP APPARATUS, RADIATION IMAGE PICKUP APPARATUS AND RADIATION IMAGE PICKUP SYSTEM

BACKGROUND OF THE INVENTION

1. Field of the Invention

The present invention relates to an image pickup apparatus, more specifically an image pickup apparatus having a horizontal scanning circuit and a vertical scanning circuit between image receiving areas. In particular, the present invention relates to a radiation image pickup apparatus and a radiation image pickup system, and more particularly to a large-area radiation image pickup apparatus for reading an image utilizing a high energy radiation such as X-ray or gamma-ray.

2. Related Background Art

An image pickup apparatus can be roughly divided into a light receiving area which detects light for example by a photodiode, and a light non-receiving area occupied by peripheral circuits such as scanning circuits.

In the actual image pickup apparatus, the peripheral circuits are often arranged in a light non-receiving area which surrounds an effective pixel area composed of plural light receiving areas.

However, since the peripheral circuits arranged around the effective pixel area composed for example of a single chip gives rise to a limitation in the compactization of the image pickup apparatus, such peripheral circuits have to be provided between the light receiving areas within the effective pixel area.

Also in case of preparing an image pickup apparatus with two or more chips, the effective pixel area has to be formed close to the boundary of each chip in order to increase the resolution at the junction boundary between the chips. For this reason, the light non-receiving area no longer exists around the effective pixel area and the peripheral circuits have to be positioned in the spaces between the light receiving areas which are closely laid down within the effective pixel areas.

In such image pickup apparatus in which the peripheral circuits are positioned in the spaces between the light receiving areas closely laid down within the effective pixel areas, the arrangement of a horizontal scanning circuit and a vertical scanning circuit gives rise to a portion where such horizontal scanning circuit and vertical scanning circuit mutually cross.

FIG. 14 illustrates an example of the layout of the horizontal scanning circuit and the vertical scanning circuit in a conventional image pickup apparatus.

FIG. 15 illustrates another example of the layout of the horizontal scanning circuit and the vertical scanning circuit in a conventional image pickup apparatus. In FIGS. 14 and 15, equivalent components are represented by a same number.

Referring to FIGS. 14 and 15, there are shown a light receiving area (photodiode) 701, a space 702 between the light receiving areas, unit circuits 703-1 to 703-4 of a vertical scanning circuit, unit circuits 704-1 to 704-4 of a horizontal scanning circuit, an area 705 where regularity is lost, and a crossing point 707 of the vertical scanning circuit and the horizontal scanning circuit.

In the conventional example shown in FIG. 14, the unit circuits 703-1 to 703-4 of the vertical scanning circuit are positioned at a constant pitch to maintain a regularity, but, in order to maintain such regularity of the unit circuits 703-1 to 703-4 of the vertical scanning circuit, the unit circuits 704-1 to 704-4 of the horizontal scanning circuit cannot be provided, at the crossing point of the scanning circuits, in the positions where such unit circuits of the horizontal scanning circuit should be positioned in order to maintain the regularity thereof but the unit circuit 704-2 of the horizontal scanning circuit is provided adjacent to that 704-1.

Also in the conventional example shown in FIG. 15, the unit circuits 704-1 to 704-4 of the horizontal scanning circuit are positioned at a constant pitch to maintain a regularity, but, in order to maintain such regularity of the unit circuits 704-1 to 704-4 of the horizontal scanning circuit, the unit circuits 703-1 to 703-4 of the vertical scanning circuit cannot be provided, at the crossing point of the scanning circuits, in the positions where such unit circuits of the vertical scanning circuit should be positioned in order to maintain the regularity thereof but the unit circuit 703-3 of the vertical scanning circuit is provided adjacent to that 703-2.

In the image pickup apparatus in which at least plural light receiving areas are closely laid down as explained in the foregoing, in case of positioning the peripheral circuits in the spaces between such light receiving areas, there inevitably results an area where the vertical scanning circuit and the horizontal scanning circuit mutually cross, and, in order to circumvent such crossing area, the periodicity of the positions of the unit circuits becomes irregular in either of the horizontal scanning circuit and the vertical scanning circuit as shown in FIGS. 14 and 15.

Consequently, a difference in the wiring length induces deterioration of the response characteristics, and the irregularity in the positioning of the unit circuits of each scanning circuit deteriorates the continuity of the pixels, thereby detrimentally affecting the image quality.

SUMMARY OF THE INVENTION

The present invention has been made in view of the above circumstances and is to provide, in an image pickup apparatus in which a horizontal scanning circuit and a vertical scanning circuit are provided in the spaces between the light receiving areas, a configuration where the periodicity of the horizontal scanning circuit and the vertical scanning circuit is not disturbed.

According to the present invention, there is provided an image pickup apparatus which is provided with plural light receiving areas arranged two-dimensionally, and a vertical scanning circuit composed of plural unit circuit stages arranged in the vertical direction and a horizontal scanning circuit composed of plural unit circuit stages arranged in the horizontal direction, for selecting and reading the aforementioned plural light receiving areas in succession and in which the vertical scanning circuit and the horizontal scanning circuit are arranged in spaces between the light receiving areas, wherein the crossing area of the vertical scanning circuit and the horizontal scanning circuit, in a space between the light receiving areas, is divided into two areas and at least a unit circuit of the horizontal scanning circuit is provided in one of the aforementioned two areas while at least a unit circuit of the vertical scanning circuit is provided in the other of the aforementioned two areas.

According to the present invention, there is also provided another image pickup apparatus which is provided with plural light receiving areas arranged two-dimensionally, and a vertical scanning circuit composed of plural unit circuit stages arranged in the vertical direction and a horizontal scanning circuit composed of plural unit circuit stages arranged in the horizontal direction, for selecting and reading the aforementioned plural light receiving areas in succession and in which the vertical scanning circuit and the horizontal scanning circuit are arranged in spaces between the light receiving areas, the apparatus comprising a space between the light receiving areas where two or more unit circuit stages of either of the vertical scanning circuit and the horizontal scanning circuit are provided and a vacant space between the light receiving areas where no unit circuit of the vertical scanning circuit and the horizontal scanning circuit is provided, wherein the aforementioned vacant space is provided in a space between the light receiving area at the crossing area of the vertical scanning circuit and the horizontal scanning circuit.

According to the present invention, there is also provided another image pickup apparatus which is provided with plural light receiving areas arranged two-dimensionally, and a vertical scanning circuit composed of plural unit circuit stages arranged in the vertical direction and a horizontal scanning circuit composed of plural unit circuit stages arranged in the horizontal direction, for selecting and reading the aforementioned plural light receiving areas in succession and in which the vertical scanning circuit and the horizontal scanning circuit are arranged in spaces between the light receiving areas, the apparatus comprising a space between the light receiving areas where two or more unit circuit stages of the vertical scanning circuit are provided, a space between the light receiving areas where two or more unit circuit stages of the horizontal scanning circuit are provided, and a vacant space between the light receiving areas where no unit circuit of the vertical scanning circuit and the horizontal scanning circuit is provided, wherein the aforementioned vacant space is provided in a space between the light receiving areas at the crossing area of the vertical scanning circuit and the horizontal scanning circuit.

According to the present invention, there is also provided another image pickup apparatus which is provided with plural light receiving areas arranged two-dimensionally, and a vertical scanning circuit composed of plural unit circuit stages arranged in the vertical direction and a horizontal scanning circuit composed of plural unit circuit stages arranged in the horizontal direction, for selecting and reading the aforementioned plural light receiving areas in succession and in which the vertical scanning circuit and the horizontal scanning circuit are arranged in spaces between the light receiving areas, wherein the unit circuits of the vertical scanning circuit and/or the unit circuits of the horizontal scanning circuit are arranged at a constant pitch.

According to the present invention, there is also provided another image pickup apparatus which is provided with plural light receiving areas arranged two-dimensionally, and a vertical scanning circuit composed of plural unit circuit stages arranged in the vertical direction and a horizontal scanning circuit composed of plural unit circuit stages arranged in the horizontal direction, for selecting and reading said plural light receiving areas in succession and in which said vertical scanning circuit and said horizontal scanning circuit are arranged in spaces between said light receiving areas, wherein the unit circuit groups each constituted by two unit circuits of said horizontal scanning circuit or said vertical scanning circuit, and said unit circuit groups are arranged at a constant pitch.

DESCRIPTION OF THE PREFERRED EMBODIMENTS

Now the present invention will be clarified in detail by embodiments thereof, with reference to the accompanying drawings.

(Embodiment 1)

Figure 1:
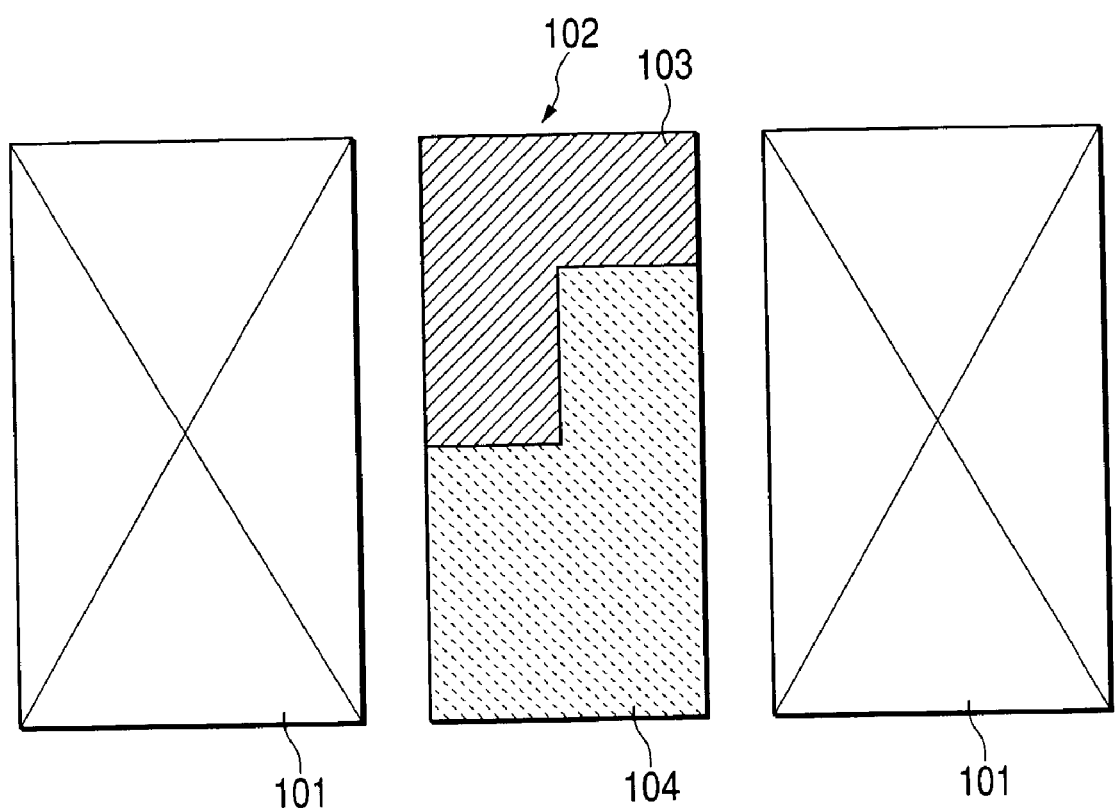
FIG. 1 is a view showing the concept of a first embodiment of the present invention.

FIG. 1 is a view showing the concept of a first embodiment of the image pickup apparatus of the present invention. Within a single solid state image pickup device chip constituting the image pickup apparatus, FIG. 1 shows two light receiving areas 101 and a space (light non-receiving area) 102 therebetween, wherein the space 102 sandwiched between the light receiving areas 101 is divided into two areas, namely an area A 103 and an area B 104. In the present embodiment, it is assumed that the area A is used for positioning a vertical scanning circuit while the area B is used for positioning a horizontal scanning circuit. With respect to the wirings, the vertical scanning circuit is wired by a first metal layer and the horizontal scanning circuit is wired by a second metal layer. The wiring for each scanning circuit may be present in plural units, but they are preferably made with a same metal layer.

Figure 2:
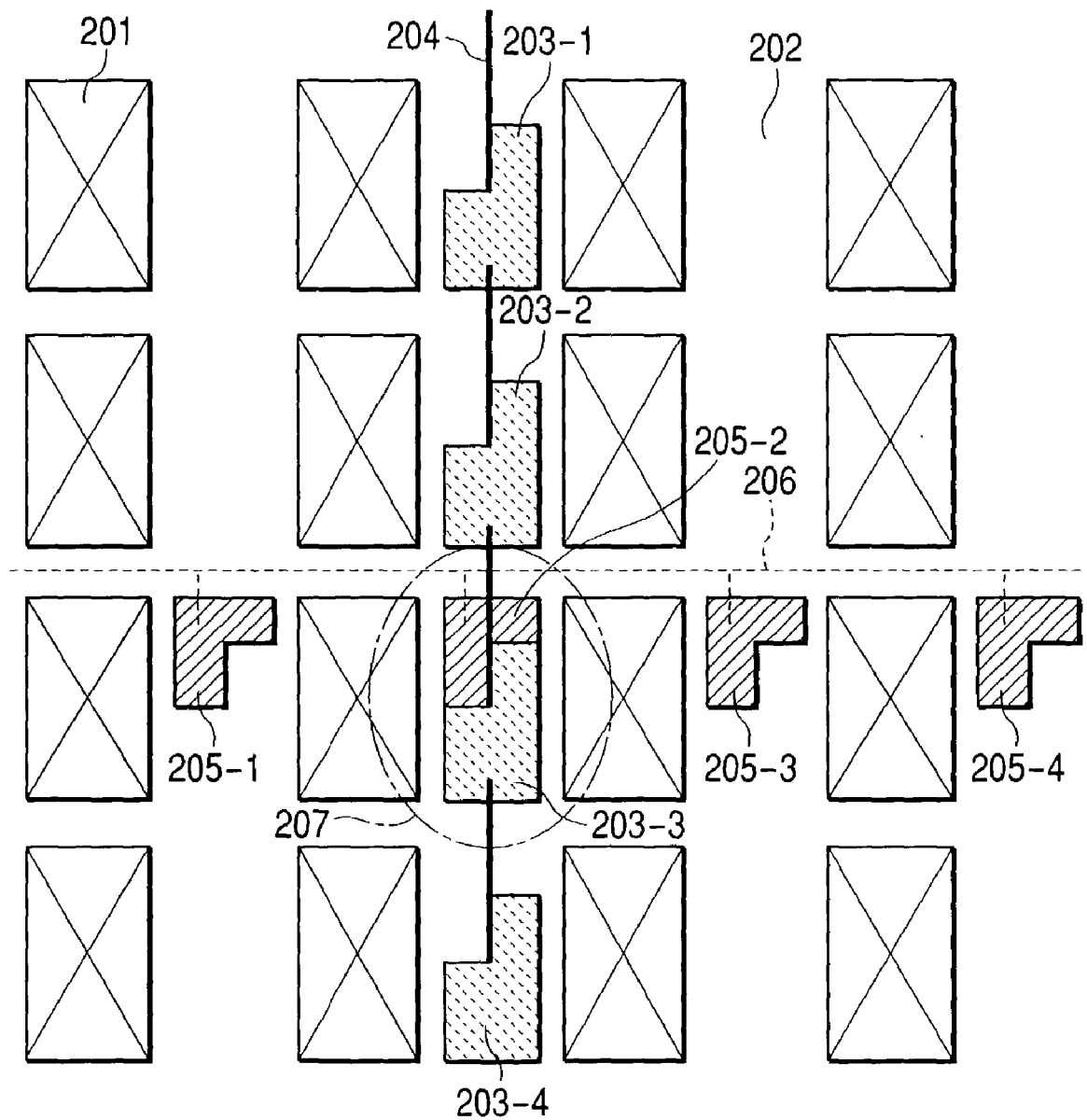
FIG. 2 is a view showing the layout of an image pickup apparatus of the first embodiment of the present invention.

FIG. 2 illustrates the layout of the image pickup apparatus. For the purpose of simplicity, there is illustrated an image pickup apparatus having 4×4 light receiving areas, but the number of the light receiving areas provided in a single solid state image pickup device chip is suitably selected according to the necessity, such as 2×2, 4×8, 8×8, . . . The present embodiment shows an image pickup apparatus constituted by a single solid state image pickup device chip, but the image pickup apparatus may also be constituted by a plurality of solid state image pickup device chips shown in FIG. 2.

Referring to FIG. 2, there are shown a light receiving area 201, a space 202 between the light receiving areas, unit circuits 203-1 to 203-4 of a vertical scanning circuit, a wiring 204 of the vertical scanning circuit, unit circuits 205-1 to 205-4 of a horizontal scanning circuit, a wiring 206 of the horizontal scanning circuit, and a crossing portion 207 of the scanning circuits. A space between the light receiving areas in the crossing portion 207 is divided into two, and a vertical scanning circuit 203-3 and a horizontal scanning circuit 205-2 are provided therein in mutually adjacent manner. As a result of such arrangement of the light receiving areas, continuity can be maintained in both the unit circuits of the horizontal scanning circuit and those of the vertical scanning circuit can maintain continuity, which can therefore be arranged respectively at a constant pitch and can be wired without a disorder even in the crossing portion. Consequently, the length of the wiring remains same for the respective unit circuits to avoid deterioration of the response characteristics, and the continuity maintained in each scanning circuit reduces the influence on the image quality.

Also, in the present embodiment, the vertical scanning circuit and the horizontal scanning circuit are positioned in the space between the light receiving areas at the center of the 4×4 light receiving areas, but the location of such positioning is not limited to that in the present embodiment. They may be provided in any position as long as the unit circuits of the vertical scanning circuit and those of the horizontal scanning circuit can be arranged respectively at a constant pitch. For example, the vertical scanning circuit in the present embodiment may be displaced in the lateral direction by a column.

(Embodiment 2)

Figure 3:
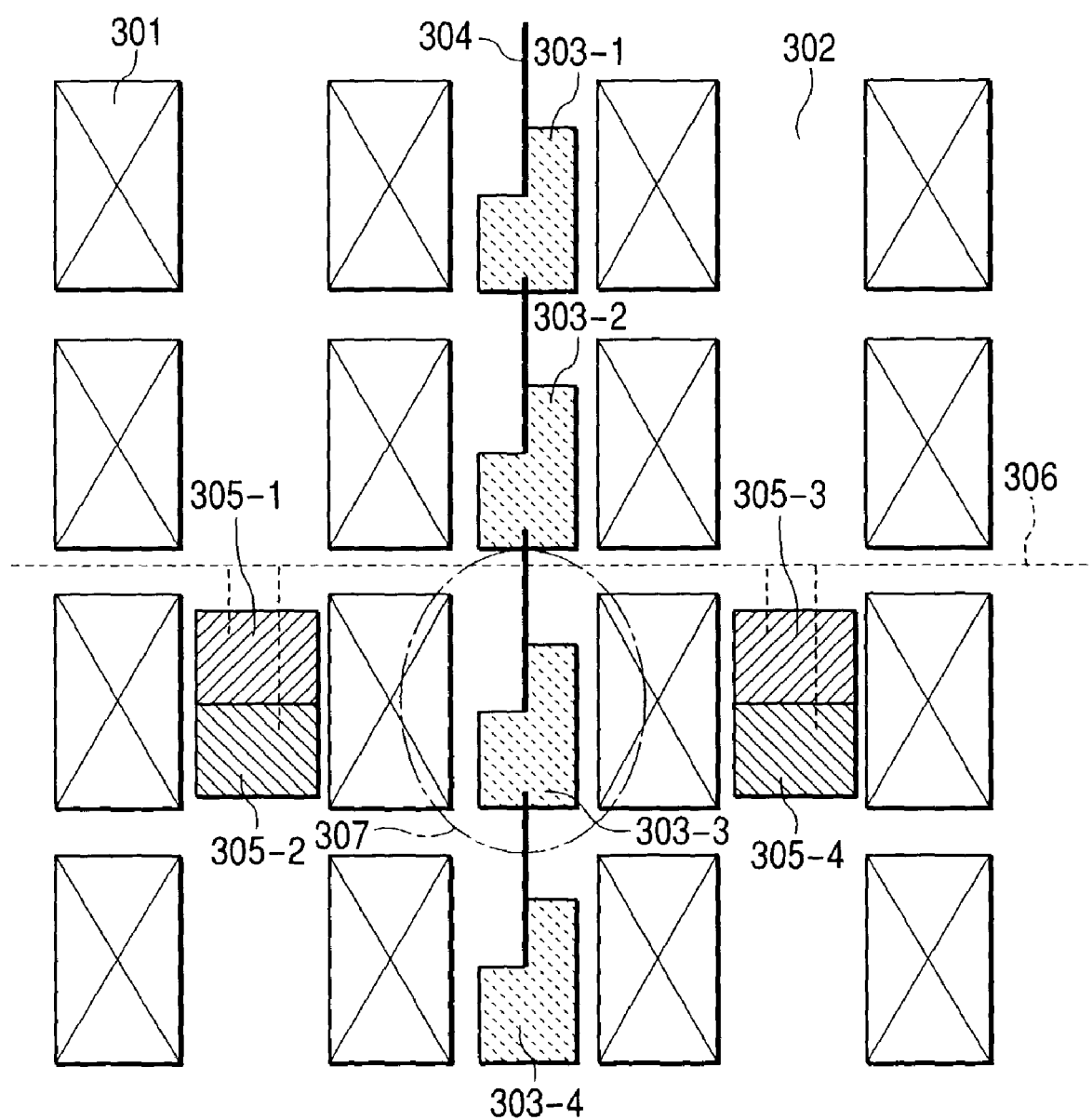
FIG. 3 is a view showing the layout of an image pickup apparatus of a second embodiment of the present invention.

FIG. 3 illustrates the layout of an image pickup apparatus of a second embodiment of the present invention.

In the present embodiment, a unit circuit of the vertical scanning circuit is provided in each space between the light receiving areas, while two unit circuits of the horizontal scanning circuit are provided in a space between the light receiving areas, and such space is alternated with a vacant space between the light receiving areas, not containing the unit circuit of the horizontal scanning circuit. With respect to the wiring, the vertical scanning circuit is wired by a first metal layer, while the horizontal scanning circuit is wired by a second metal layer. The wiring of each scanning circuit may be present in plural units, but such wirings of each scanning circuit are preferably prepared in a same metal layer.

For the purpose of simplicity, there is illustrated an image pickup apparatus having 4×4 light receiving areas, but the number of the light receiving areas provided in a single solid state image pickup device chip is suitably selected according to the necessity, such as 2×2, 4×8, 8×8, . . .

Also in the following embodiments, the number of the light receiving areas is similarly determined in suitable manner.

The present embodiment shows an image pickup apparatus constituted by a single solid state image pickup device chip, but the image pickup apparatus may also be constituted by a plurality of solid state image pickup device chips shown in FIG. 3.

Following embodiments will also be explained by an image pickup apparatus constituted by a single solid state image pickup device chip, but the image pickup apparatus may likewise be constituted by a plurality of solid state image pickup device chips.

The present embodiment is different from that shown in FIG. 2 in that the horizontal scanning circuit is not provided in the crossing portion of the vertical scanning circuit and the horizontal scanning circuit.

Referring to FIG. 3, there are shown a light receiving area 301, a space 302 between the light receiving areas, unit circuits 303-1 to 303-4 of a vertical scanning circuit, a wiring 304 of the vertical scanning circuit, unit circuits 305-1 to 305-4 of a horizontal scanning circuit, a wiring 306 of the horizontal scanning circuit, and a crossing portion 307 of the scanning circuits. In a space 302 between the light receiving areas in the crossing portion 307 there is only provided a unit circuit 303-3 of the vertical scanning circuit, and, in the left and right spaces between the light receiving areas laterally across the space in the crossing portion, there are respectively provided unit circuits 305-1, 305-2 of the horizontal scanning circuit and unit circuits 305-3, 305-4 of the horizontal scanning circuit.

As a result, the unit circuits of the vertical scanning circuit are arranged at a constant pitch, while, in the horizontal scanning circuit, unit circuit groups each constituted by two unit circuits of the horizontal scanning circuit are arranged at a constant pitch, whereby the continuity is maintained and the wiring can be formed without disorder even in the crossing portion 307 of the scanning circuits. Consequently, the length of the wiring remains same for the respective unit circuits to avoid deterioration of the response characteristics, and the continuity maintained in each scanning circuit reduces the influence on the image quality.

The above-mentioned unit circuit groups means a unit circuit group constituted by the unit circuits 305-1 and 305-2, and a unit circuit group constituted by the unit circuit 305-3 and 305-4.

Figure 14:
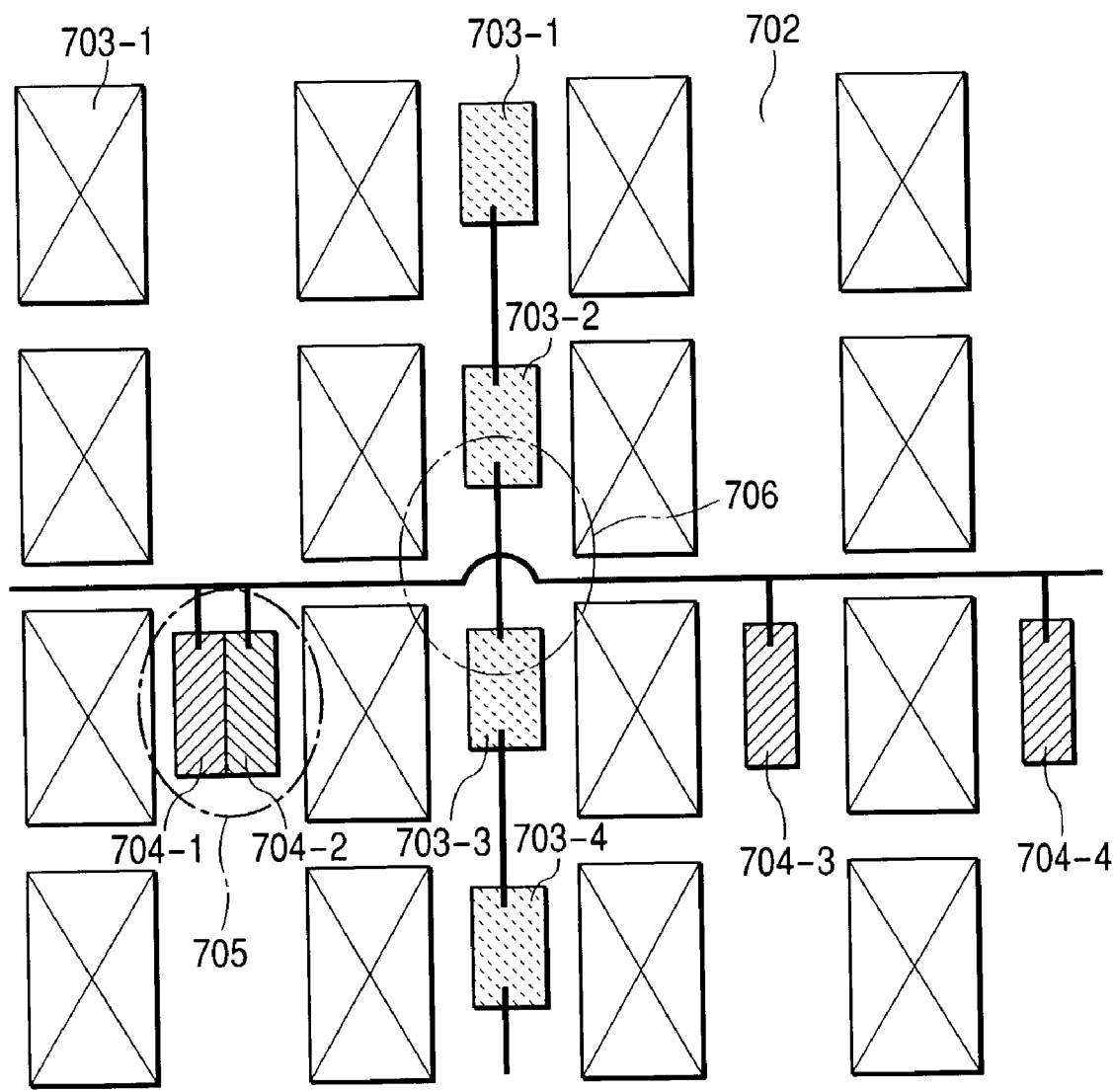
FIG. 14 is a view showing an example of the layout of a horizontal scanning circuit and a vertical scanning circuit in a conventional image pickup apparatus.
Figure 15:
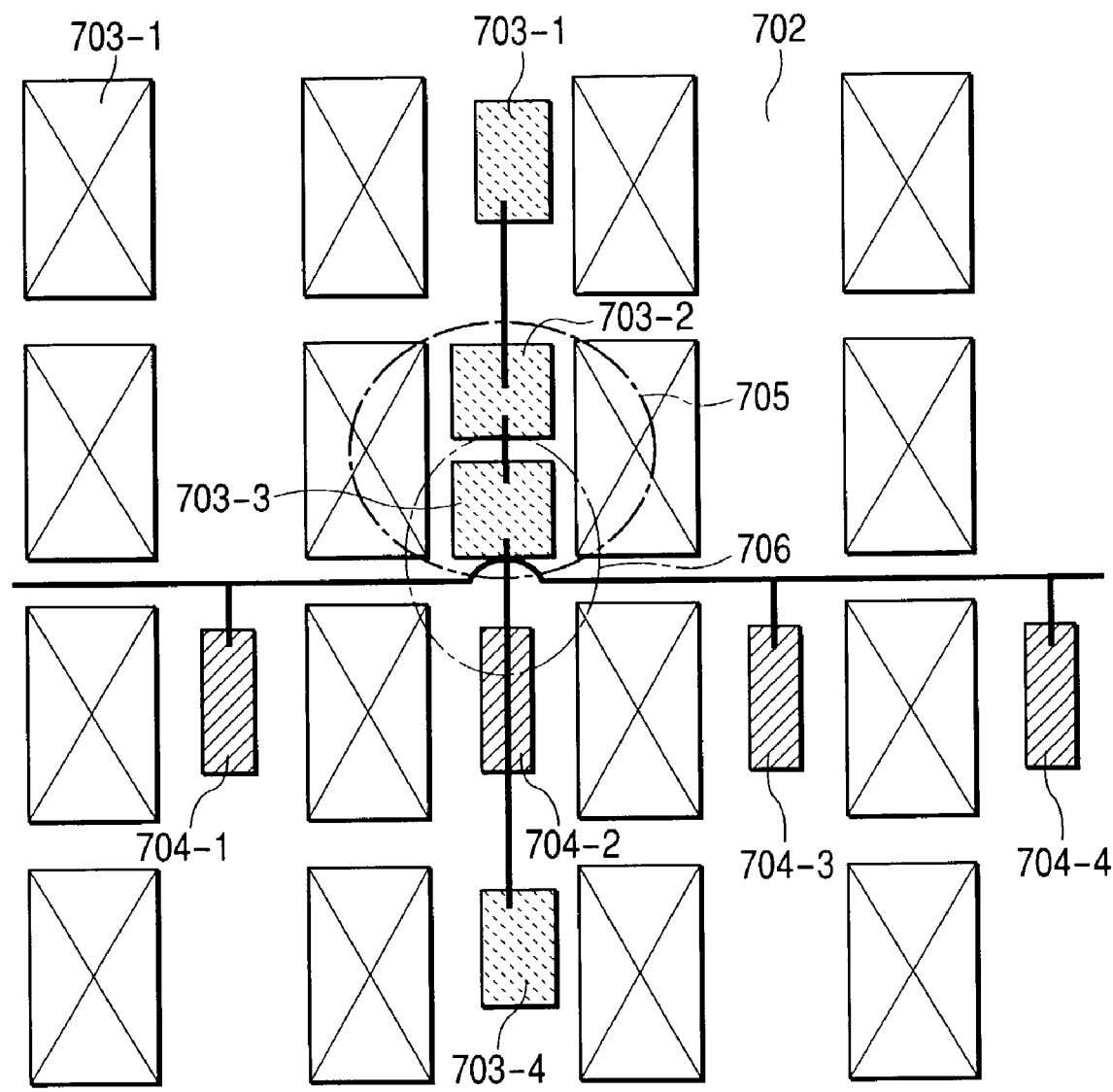
FIG. 15 is a view showing another example of the layout of a horizontal scanning circuit and a vertical scanning circuit in a conventional image pickup apparatus.

The length of the wiring remaining same in the present embodiment means the following situation. In the conventional configuration, an irregularly varying length of the wiring results in a deterioration of the image quality in a position corresponding to such variation of the wiring length (for example area 705 in FIG. 14), but the use of two wiring lengths only (namely length between the unit circuits 305-1 and 305-2 and that between the unit circuits 305-2 and 305-3) as in the present invention allows to reduce the influence on the image quality, because of the absence of an unexpected difference in the length of the wiring.

Also, in the present embodiment, the vertical scanning circuit and the horizontal scanning circuit are positioned in the space between the light receiving areas at the center of the 4×4 light receiving areas, but the location of such positioning is not limited to that in the present embodiment. They may be provided in any position as long as the unit circuits of the vertical scanning circuit and those of the horizontal scanning circuit can be arranged respectively at a constant pitch. For example, the vertical scanning circuit in the present embodiment may be displaced in the lateral direction by a column.

Also in the following embodiments, the vertical scanning circuit and the horizontal scanning circuit are similarly provided in the space between the light receiving areas at the center of 4×4 light receiving areas, but the location of such positioning is not limited to such case.

(Embodiment 3)

Figure 4:
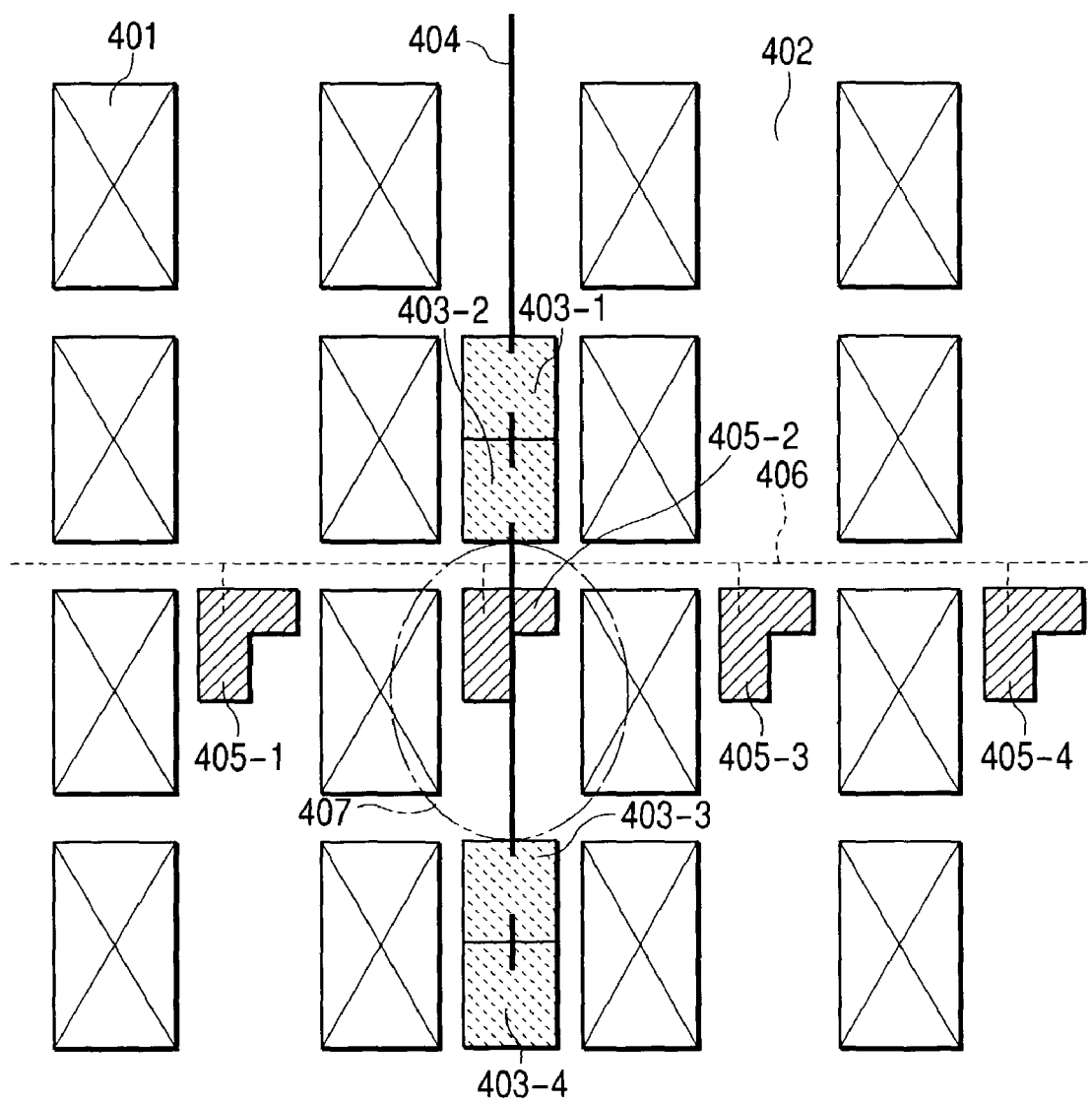
FIG. 4 is a view showing the layout of an image pickup apparatus of a third embodiment of the present invention.

FIG. 4 illustrates the layout of an image pickup apparatus of a third embodiment of the present invention.

In the present embodiment, two unit circuits of the vertical scanning circuit are provided in a space between the light receiving areas, and such space is alternated with a vacant space between the light receiving areas, not containing the unit circuit of the vertical scanning circuit, while a unit circuit of the horizontal scanning circuit is provided in each space between the light receiving areas. With respect to the wiring, the vertical scanning circuit is wired by a first metal layer, while the horizontal scanning circuit is wired by a second metal layer. The wiring of each scanning circuit may be present in plural units, but such wirings of each scanning circuit are preferably prepared in a same metal layer.

The present embodiment is different from that shown in FIG. 2 in that the vertical scanning circuit is not provided in the crossing portion of the vertical scanning circuit and the horizontal scanning circuit.

Referring to FIG. 4, there are shown a light receiving area 401, a space 402 between the light receiving areas, unit circuits 403-1 to 403-4 of a vertical scanning circuit, a wiring 404 of the vertical scanning circuit, unit circuits 405-1 to 405-4 of a horizontal scanning circuit, a wiring 406 of the horizontal scanning circuit, and a crossing portion 407 of the scanning circuits. In a space 402 between the light receiving areas in the crossing portion 407 there is only provided a unit circuit 405-2 of the horizontal scanning circuit, and, in the upper and lower spaces between the light receiving areas vertically across the space in the crossing portion, there are respectively provided unit circuits 403-1, 403-2 of the vertical scanning circuit and unit circuits 403-3, 403-4 of the vertical scanning circuit.

As a result, the unit circuits of the horizontal scanning circuit are arranged at a constant pitch, while, in the vertical scanning circuit, unit circuit groups each constituted by two unit circuits of the vertical scanning circuit are arranged at a constant pitch, whereby the continuity is maintained and the wiring can be formed without disorder even in the crossing portion 407 of the scanning circuits. Consequently, the length of the wiring remains same for the respective unit circuits to avoid deterioration of the response characteristics, and the continuity maintained in each scanning circuit reduces the influence on the image quality.

The above-mentioned unit circuit groups mean a unit circuit group constituted by the unit circuits 403-1 and 403-2, and a unit circuit group constituted by the unit circuit 403-3 and 403-4.

The length of the wiring remaining same in the present embodiment means the following situation. In the conventional configuration, an irregularly varying length of the wiring results in a deterioration of the image quality in a position corresponding to such variation of the wiring length (for example area 705 in FIG. 10), but the use of two wiring lengths only (namely length between the unit circuits 403-1 and 403-2 and that between the unit circuits 403-2 and 403-3) as in the present invention allows to reduce the influence on the image quality, because of the absence of an unexpected difference in the length of the wiring.

(Embodiment 4)

Figure 5:
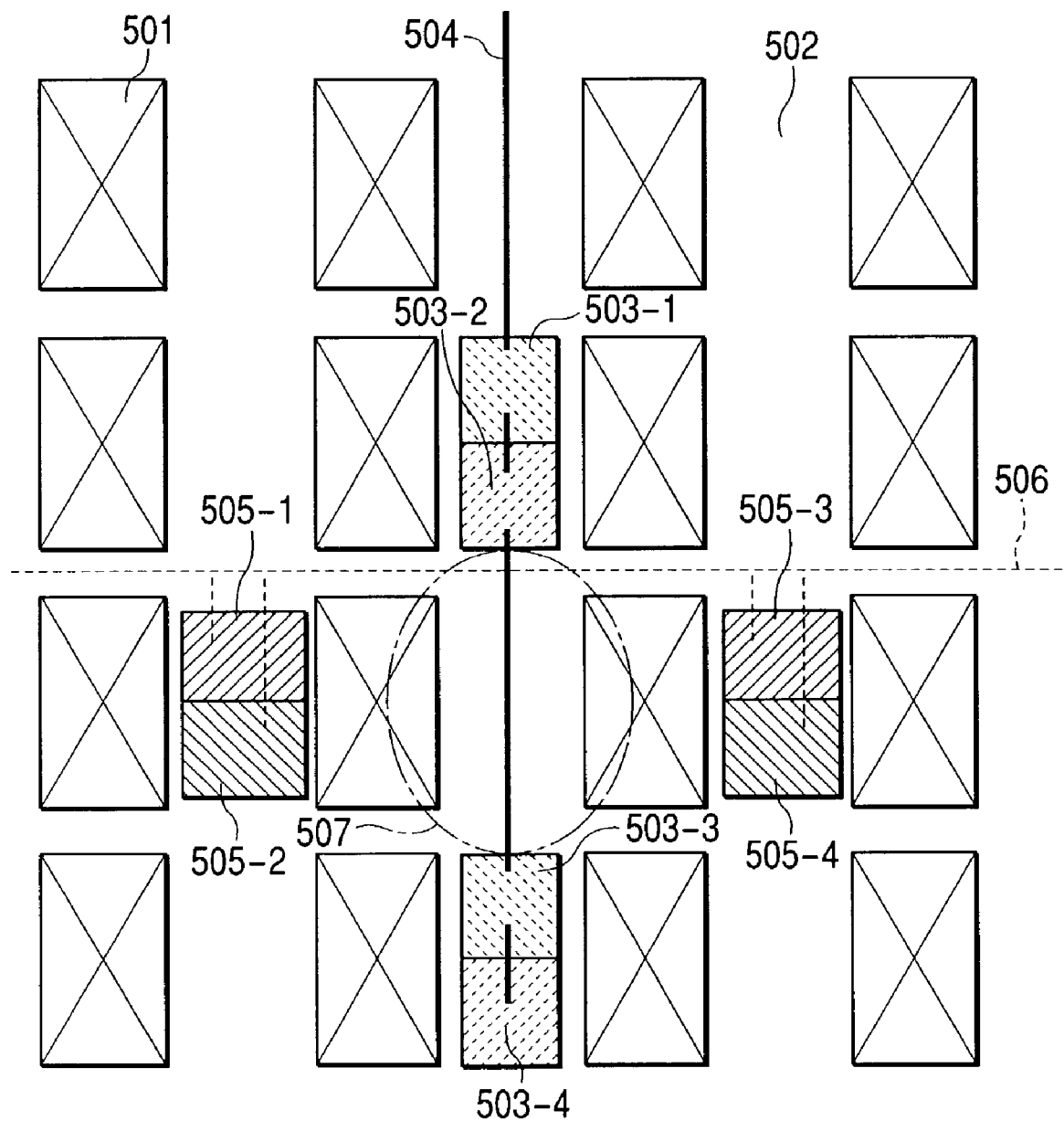
FIG. 5 is a view showing the layout of an image pickup apparatus of a fourth embodiment of the present invention.

FIG. 5 illustrates the layout of an image pickup apparatus of a fourth embodiment of the present invention.

In the present embodiment, two unit circuits of the vertical scanning circuit are provided in a space between the light receiving areas, and such space is alternated with a vacant space between the light receiving areas, not containing the unit circuit of the vertical scanning circuit, while two unit circuits of the horizontal scanning circuit are provided in a space between the light receiving areas, and such space is alternated with a vacant space between the light receiving areas, not containing the unit circuit of the horizontal scanning circuit. With respect to the wiring, the vertical scanning circuit is wired by a first metal layer, while the horizontal scanning circuit is wired by a second metal layer. The wiring of each scanning circuit may be present in plural units, but such wirings of each scanning circuit are preferably prepared in a same metal layer.

The present embodiment is different from that shown in FIG. 2 in that a vacant space not containing the horizontal scanning circuit nor the vertical scanning circuit is provided in the crossing portion of the vertical scanning circuit and the horizontal scanning circuit.

Referring to FIG. 5, there are shown a light receiving area 501, a space 502 between the light receiving areas, unit circuits 503-1 to 503-4 of a vertical scanning circuit, a wiring 504 of the vertical scanning circuit, unit circuits 505-1 to 505-4 of a horizontal scanning circuit, a wiring 506 of the horizontal scanning circuit, and a crossing portion 507 of the scanning circuits. In a space 502 between the light receiving areas in the crossing portion 507 there is not provided the vertical scanning circuit nor the horizontal scanning circuit, and, across such space at the crossing portion, there are respectively provided at left and right the unit circuits 505-1, 505-2 of the horizontal scanning circuit and the unit circuits 505-3, 505-4 of the horizontal scanning circuit, and, above and below such space there are respectively provided the units circuits 503-1, 503-2 of the vertical scanning circuit and the unit circuits 503-3, 503-4 of the vertical scanning circuit.

As a result, the unit circuit groups of the vertical scanning circuit and the unit circuit groups of the horizontal scanning circuit are respectively arranged at a constant pitch, whereby the continuity is maintained and the wiring can be formed without disorder even in the crossing portion 507 of the scanning circuits. Consequently, the length of the wiring remains same for the respective unit circuits to avoid deterioration of the response characteristics, and the continuity maintained in each scanning circuit reduces the influence on the image quality.

The above-mentioned unit circuit groups means a unit circuit group constituted by the unit circuits 505-1 and 505-2 and a unit circuit group constituted by the unit circuit 505-3 and 505-4 of the horizontal scanning circuit, and a unit circuit group constituted by the unit circuits 503-1 and 503-2 and a unit circuit group constituted by the unit circuit 503-3 and 503-4 of the vertical scanning circuit.

The length of the wiring remaining same in the present embodiment means the following situation. In the conventional configuration, an irregularly varying length of the wiring results in a deterioration of the image quality in a position corresponding to such variation of the wiring length (for example area 705 in FIG. 10), but the use of two wiring lengths only in each scanning circuit as in the present invention allows to reduce the influence on the image quality, because of the absence of an unexpected difference in the length of the wiring.

(Embodiment 5)

Figure 6:
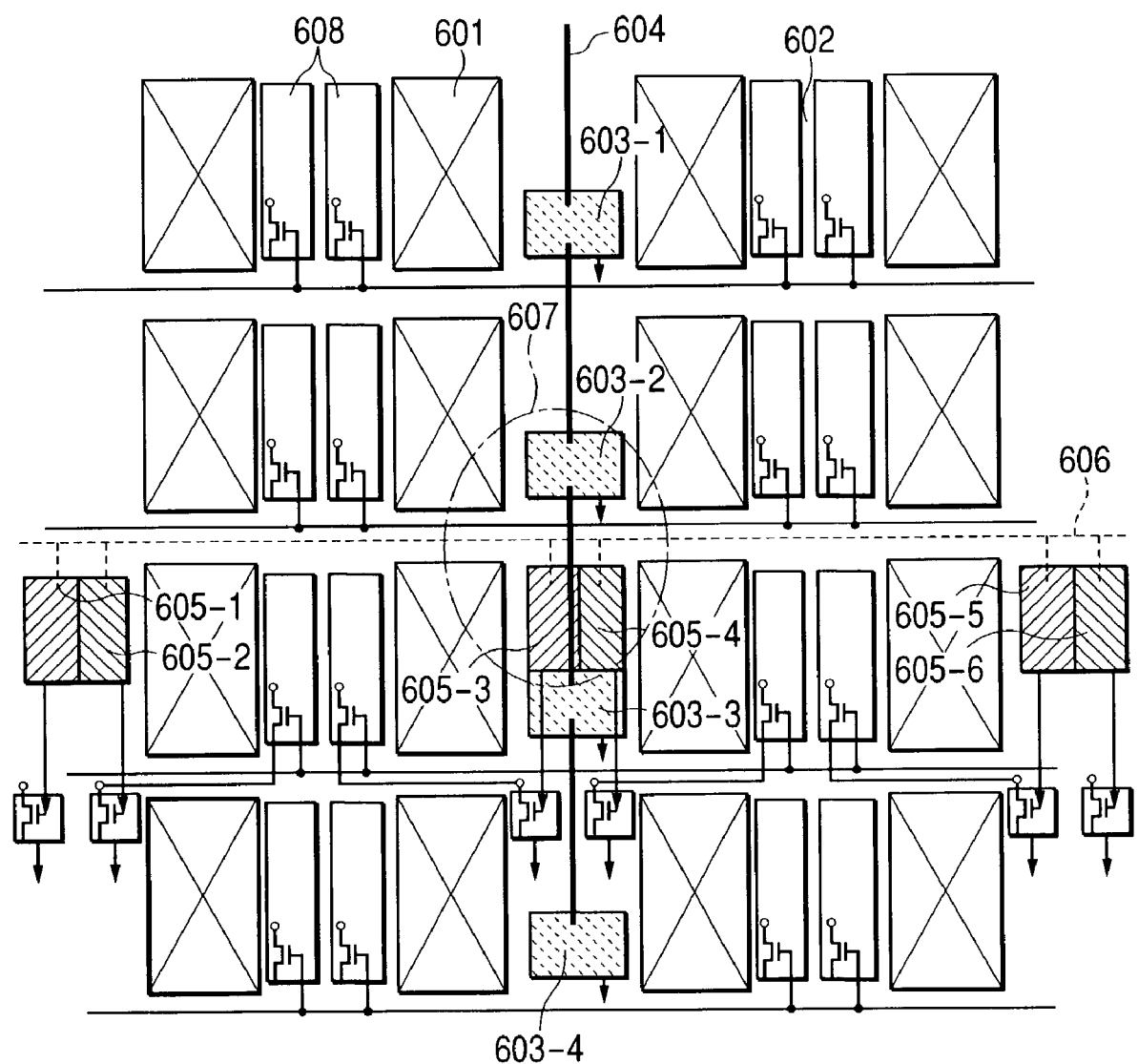
FIG. 6 is a view showing the layout of an image pickup apparatus of a fifth embodiment of the present invention.

FIG. 6 illustrates the layout of an image pickup apparatus of a fifth embodiment of the present invention.

In the present embodiment, two unit circuits of the horizontal scanning circuit are provided in a space between the light receiving areas, and such space is alternated with a vacant space between the light receiving areas, not containing the unit circuit of the horizontal scanning circuit, while a unit circuit of the vertical scanning circuit is provided in each space between the light receiving areas. With respect to the wiring, the vertical scanning circuit is wired by a first metal layer, while the horizontal scanning circuit is wired by a second metal layer. The wiring of each scanning circuit may be present in plural units, but such wirings of each scanning circuit are preferably prepared in a same metal layer.

In the present embodiment, in order to position the horizontal and vertical scanning circuits avoiding a peripheral circuit for driving the optical signal from the light receiving areas, a space between the light receiving areas including a unit circuit of the vertical scanning circuit is provided in the crossing portion of the vertical scanning circuit and the horizontal scanning circuit. Therefore, the crossing portion is occupied by two unit circuits of the horizontal scanning circuit and a unit circuit of the vertical scanning circuit. The space between the light receiving areas is divided into two areas of which one is used for providing the two unit circuits of the horizontal scanning circuit while the other is used for providing the unit circuit of the vertical scanning circuit.

Referring to FIG. 6, there are shown a light receiving area 601, a space 602 between the light receiving areas, unit circuits 603-1 to 603-4 of a vertical scanning circuit, a wiring 604 of the vertical scanning circuit, unit circuits 605-1 to 605-6 of a horizontal scanning circuit, a wiring 606 of the horizontal scanning circuit, a crossing portion 607 of the scanning circuits, and a pixel peripheral circuit 608 for driving the pixels. The output of the vertical scanning circuit 603 is used for operating a switch of the peripheral circuit.

As a result, the unit circuits of the vertical scanning circuit are arranged at a constant pitch, while, in the horizontal scanning circuit, unit circuit groups each constituted by two unit circuits of the horizontal scanning circuit are arranged at a constant pitch, whereby the continuity is maintained and the wiring can be formed without disorder even in the crossing portion 607 of the scanning circuits. Consequently, the length of the wiring remains same for the respective unit circuits to avoid deterioration of the response characteristics, and the continuity maintained in each scanning circuit reduces the influence on the image quality.

The length of the wiring remaining same in the present embodiment means the following situation. In the conventional configuration, an irregularly varying length of the wiring results in a deterioration of the image quality in a position corresponding to such variation of the wiring length (for example area 705 in FIG. 10), but the use of two wiring lengths only as in the present invention allows to reduce the influence on the image quality, because of the absence of an unexpected difference in the length of the wiring.

The embodiments explained in the foregoing have shown, as an example of the image pickup apparatus, the layouts of the light receiving areas in a single solid-state image pickup device chip, and of the horizontal scanning circuit and the vertical scanning circuit to be arranged between the light receiving areas. In such image pickup apparatus, the effective pixel area constituted by plural light receiving areas can be extended to the edge of the chip, and the number of pixels can be increased for a given chip size.

Also in the present invention, an image pickup apparatus can also be constituted by adjoining the above-mentioned solid-state image pickup device chips in one direction or two-dimensionally, and the effects explained in the foregoing embodiments and the effects explained above can be obtained also in such case.

Now there will be given a detailed explanation on the drive method for the image pickup apparatus of the foregoing embodiment, with reference to FIGS. 7 and 8.

Figure 7:
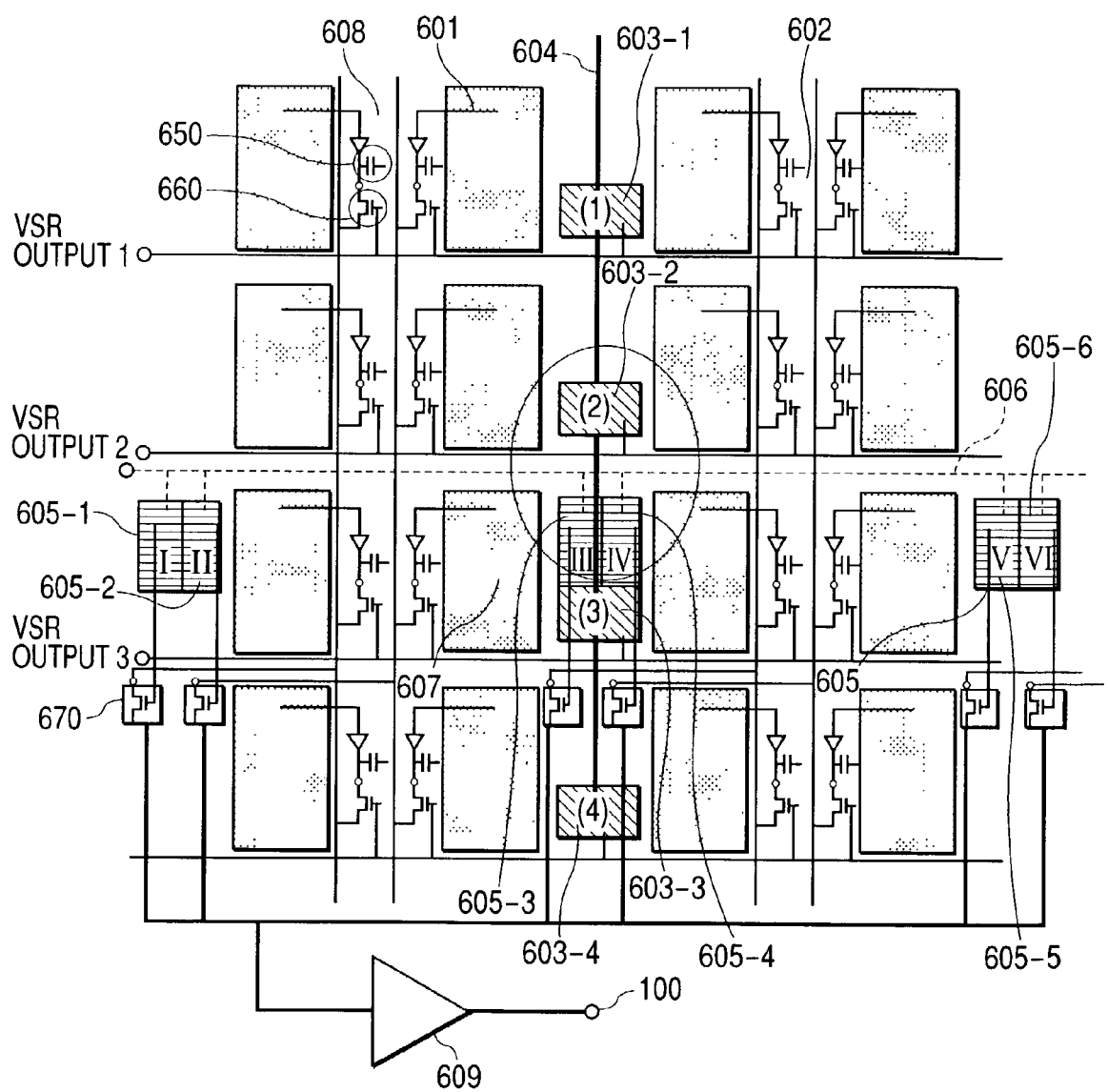
FIG. 7 is a view showing a layout of the configuration necessary for driving the image pickup apparatus of the fifth embodiment of the present invention.
Figure 8:
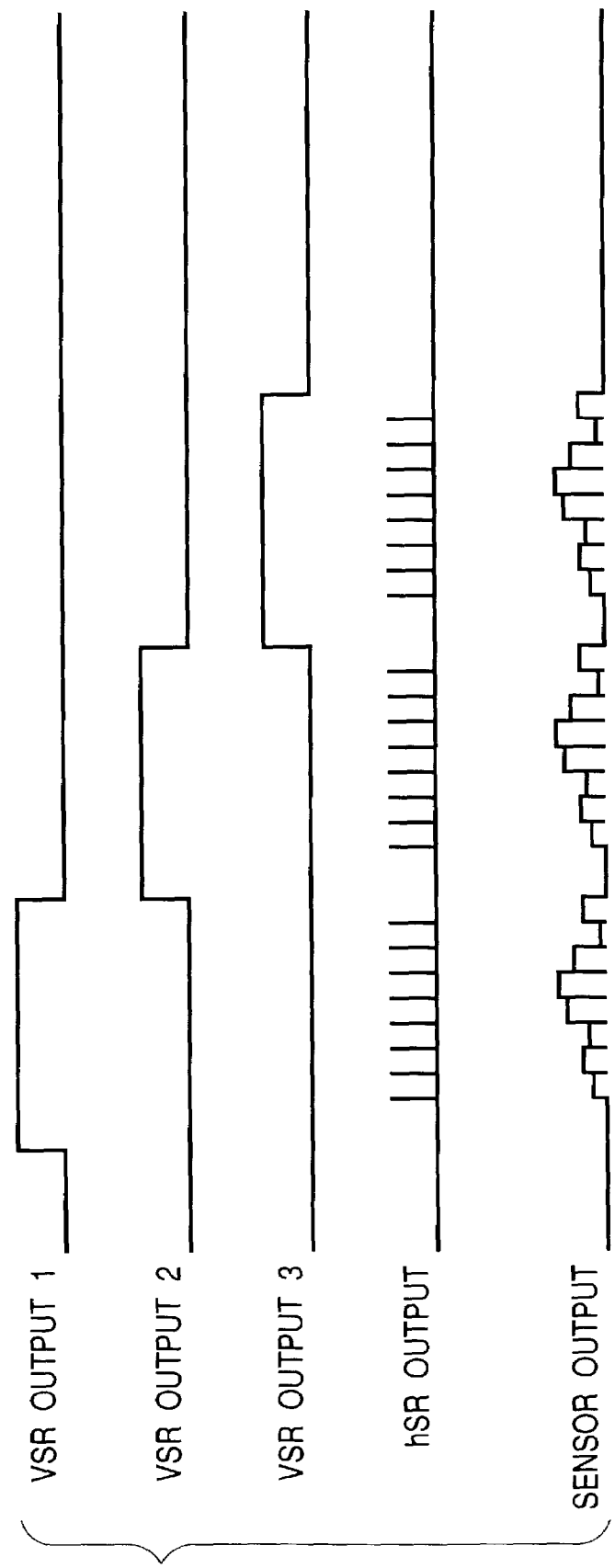
FIG. 8 is a timing chart for explaining a driving method for the image pickup apparatus of the fifth embodiment of the present invention.

FIG. 7 is a layout chart showing an example of the configuration necessary for driving the image pickup apparatus shown in FIG. 6, and FIG. 8 is a timing chart for explaining the drive method for the image pickup apparatus shown in FIG. 7.

Referring to FIG. 7, VSR1 to VSR3 denote respectively output lines of unit circuits 603-1 to 603-3 of vertical scanning circuit. An amplifier circuit 609 for amplifying the output from pixels, and a terminal 100 for outputting a sensor output after amplification by the amplifier circuit 609. In FIG. 8, there are shown a capacitor 650 for accumulating the output from the pixels, 660 denote MOS transistors for switch, which operate responsive to output signals from output lines VSR1 to VSR3. While, 670 denote MOS transistors for switch, which operate responsive to signals from wirings 606 of the horizontal scanning circuit.

In the function of the image pickup apparatus of the present invention, at an optical signal is converted by a photodiode into a charge. The converted charge is amplified in an amplifying unit provided in each pixel, and is accumulated in a capacitor a. Then, in response to a VSR output 1, a switch b of the first row is turned on to select the first row. Then in response to the output signals from the terminal HSR, switches c are turned on in succession toward right whereby the signals of a row are supplied to the amplifier 609. Subsequently in response to a VSR output 2, the second row is selected in a similar manner and the row signals are supplied to the amplifier. Operations are thereafter conducted similarly for the third and subsequent rows.

Figure 9:
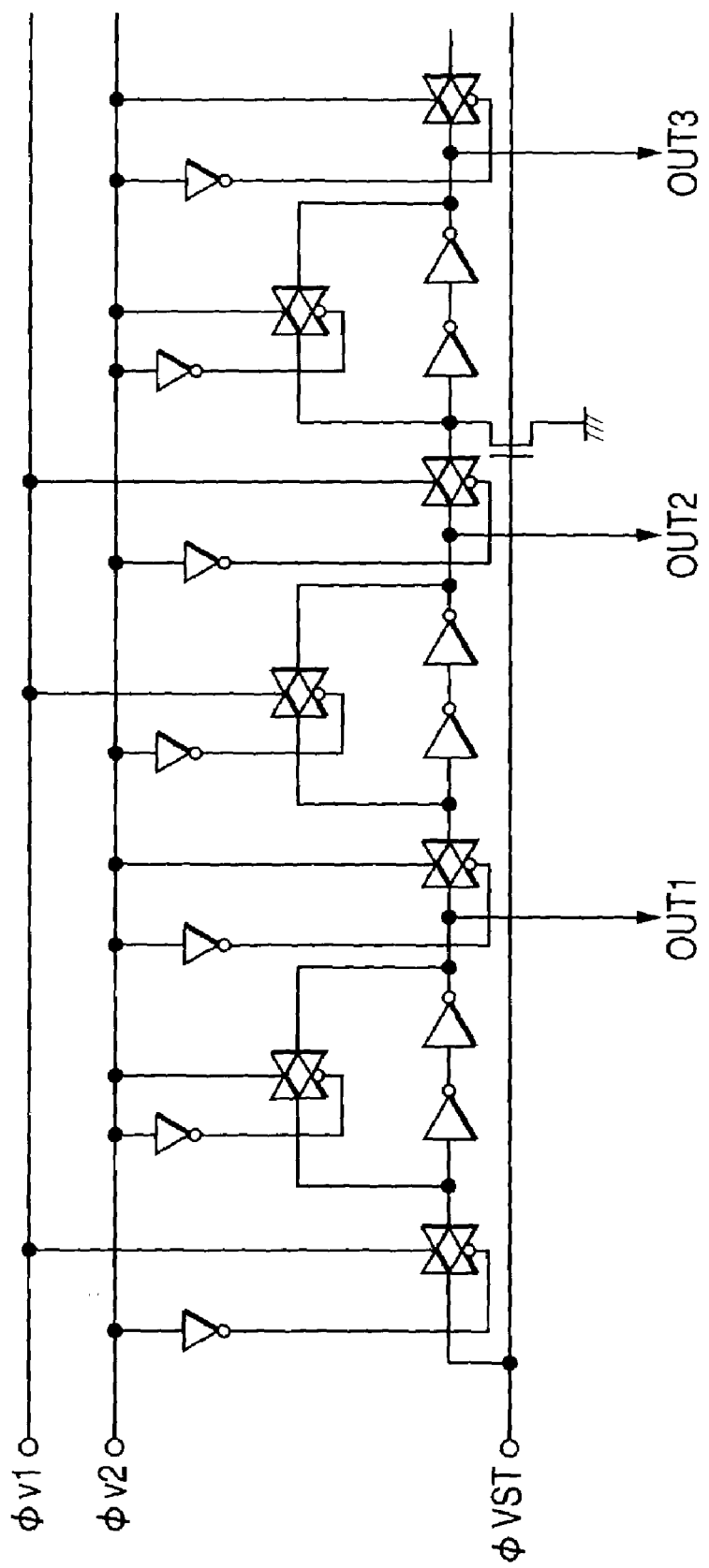
FIG. 9 is a circuit diagram showing an example of the configuration of a dynamic shift register which can be employed in the vertical scanning circuit or the horizontal scanning circuit in the present invention.
Figure 10:
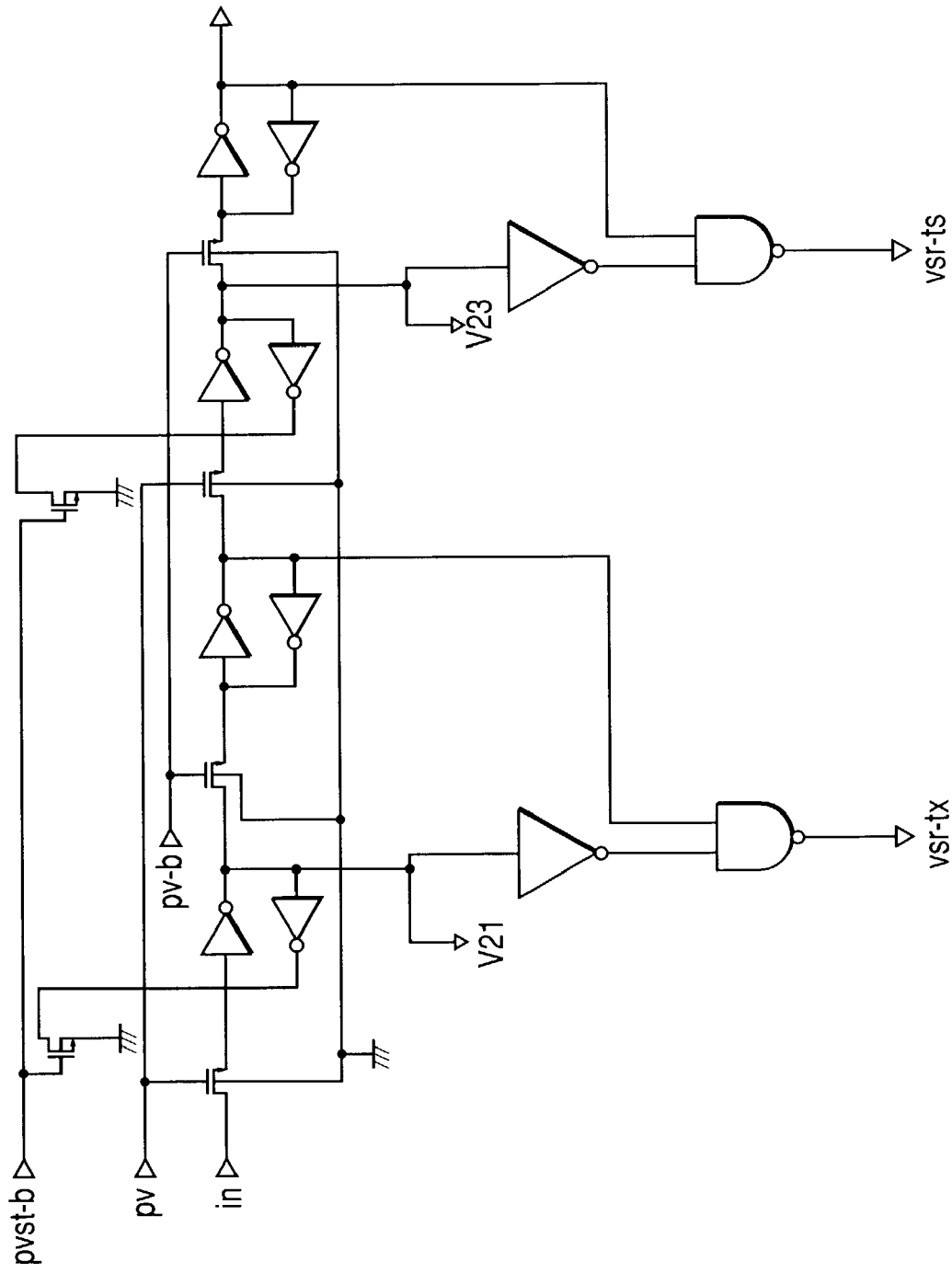
FIG. 10 is a circuit diagram showing an example of the configuration of a static shift register which can be employed in the vertical scanning circuit or the horizontal scanning circuit in the present invention.

In the present embodiment, the vertical shift register is activated in succession from 603-1 to 603-4, but the order of activation can be suitably determined and is not limited to the present embodiment. Also the horizontal shift register in the present embodiment is activated in succession from 605-1 to 605-6, but the order of activation can be suitably determined and is not limited to the present embodiment. FIG. 9 is a circuit diagram showing the configuration of a vertical scanning circuit of the present invention and a dynamic shift register employable in the vertical scanning circuit, and FIG. 10 is a circuit diagram showing the configuration of a vertical scanning circuit of the present invention and a static shift register employable in the vertical scanning circuit.

Figure 11:
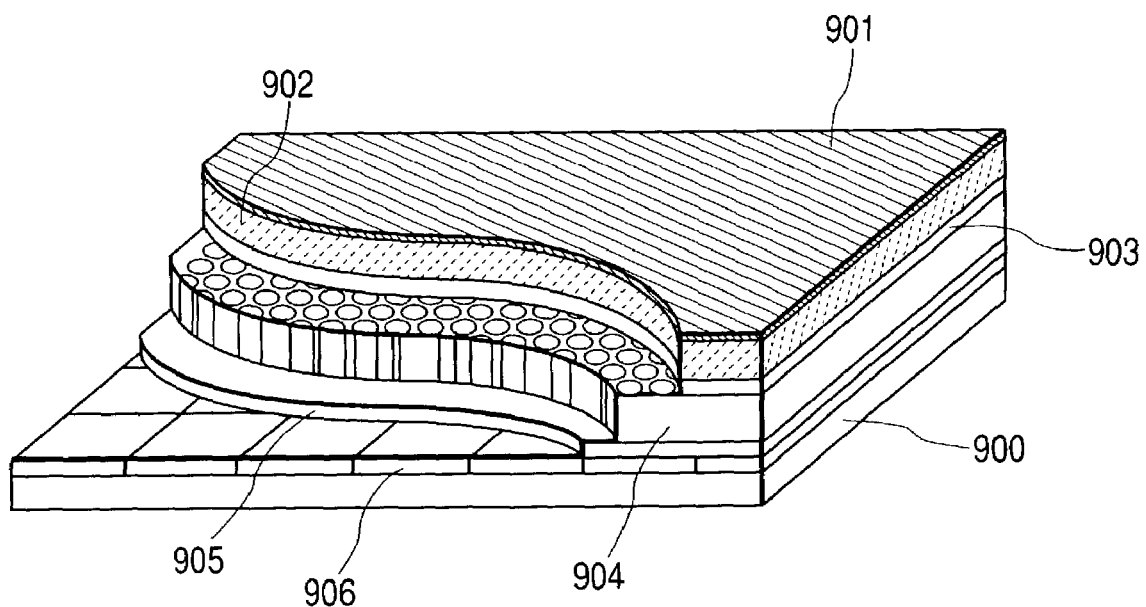
FIGS. 11 and 12 are schematic perspective views of a radiation image pickup apparatus employing an image pickup apparatus of the present invention.

FIG. 11 is a schematic perspective view showing an example of a radiation image pickup apparatus which is constituted by laminating an image pickup apparatus of the invention, a scintillator plate for converting a radiation into a visible light, a translucent substrate and an erect-imaging lens array of equal magnification.

The radiation image pickup apparatus, incorporating the image pickup apparatus of the present invention, is provided on a supporting substrate 900, in the order from the entering side of X-ray, with a light reflecting film 901, a fluorescent member (scintillator) 902 constituting a wavelength converting member, a translucent member 903, an erect-imaging lens array 904 of equal magnification which is formed by integrating a light conductive member of distributed refractive index type and is capable of forming an erect image at a short focal distance, a translucent substrate 905 and a photosensor chip 906 constituted by the image pickup apparatus of the present invention.

Figure 12:
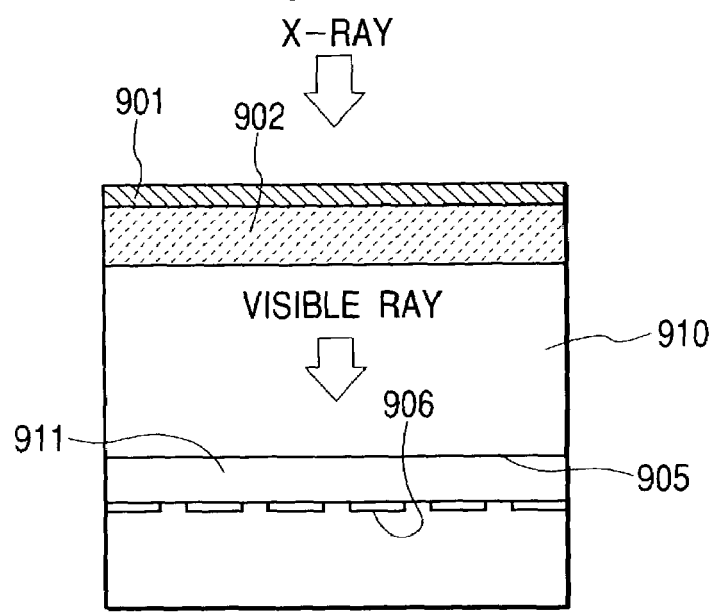

FIG. 12 is a schematic cross-sectional view showing an example of a radiation image pickup apparatus which is constituted by laminating an image pickup apparatus of the invention, a scintillator plate for converting a radiation into a visible light, and a fiber optics plate thereby improving the image quality.

In the radiation image pickup apparatus shown in FIG. 12, the erect-imaging lens array 904 of equal magnification is dispensed with and the scintillator 902 and the photosensor chip 906 are connected by the fiber optics plate (FOP) 910. An adhesive material 911 is provided if necessary in adhering the FOP 910 and the photosensor chip 906.

Figure 13:
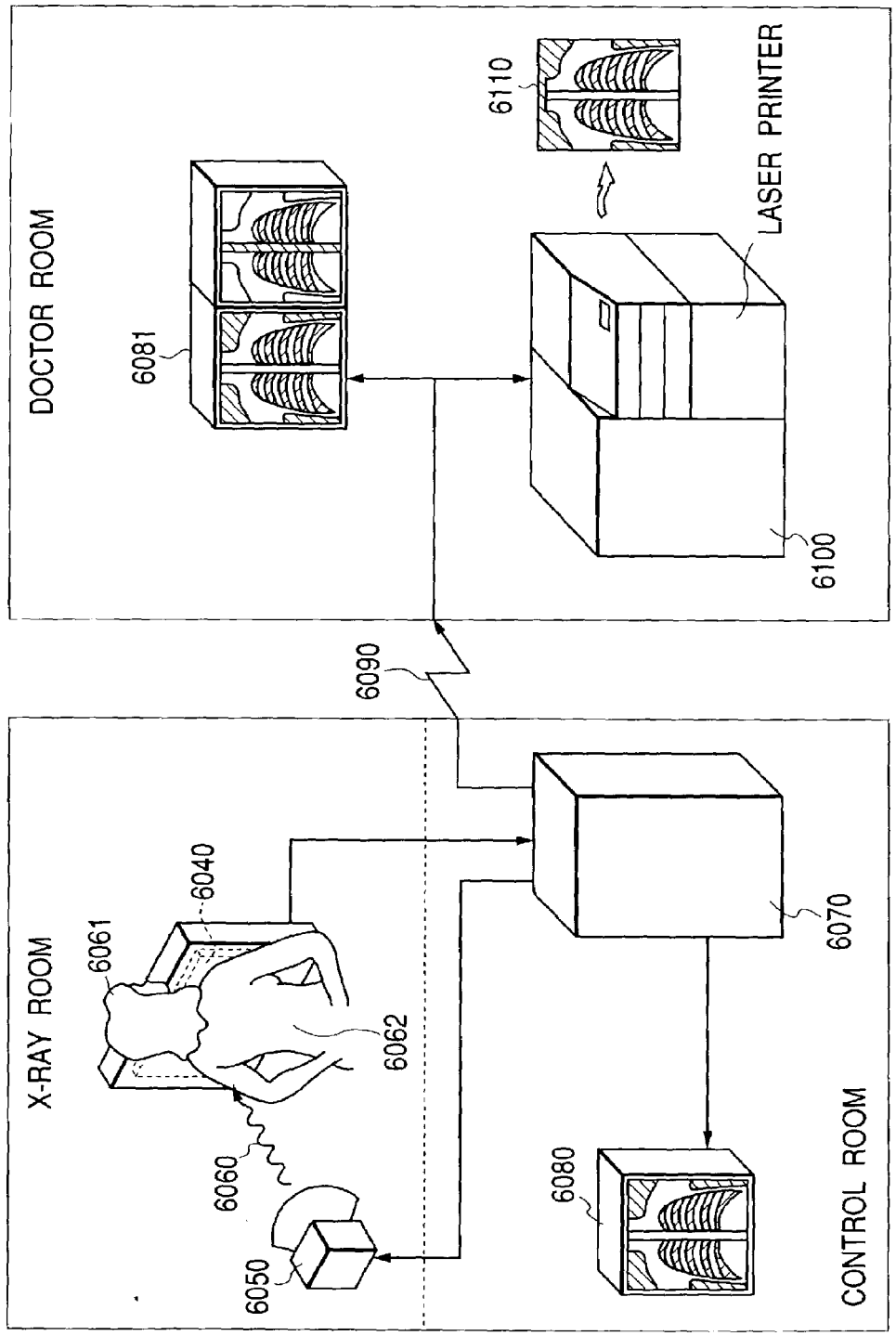
FIG. 13 is a conceptual view showing the configuration of a radiation image pickup apparatus utilizing a radiation image pickup apparatus of the present invention.

FIG. 13 shows an example of application of the radiation image pickup apparatus of the present invention to an X-ray diagnosis system.

An X-ray 6060 generated by an X-ray tube 6050 is transmitted by the chest portion 6062 of a patient or an inspected person 6061 and enters a radiation image pickup apparatus 6040 provided with a scintillator for converting the radiation into light, an FOP (fiber optics plate) for guiding the light to an image pickup apparatus, an image pickup apparatus and an external process substrate. The entering X-ray contains information of the interior of the body of the patient 6061. In response to the entering X-ray, the scintillator emits light, which is subjected to photoelectric conversion by the image pickup device to obtain electrical information. Such information is converted into a digital signal, which is subjected to image processing by an image processor 6070 and is observed by a display 6080 in a control room.

Such information can also be transferred to a remote location by transmission means such as a telephone line 6090, and displayed on a display 6081 for example in a doctor room in another location or stored in storage means such as an optical disk, for diagnosis by a doctor in the remote location. It can also be recorded by a film processor 6100 on a film 6110.

What is claimed is:

1. An image pickup apparatus which is provided with plural light receiving areas arranged two-dimensionally, and a vertical scanning circuit composed of plural unit circuit stages arranged in the vertical direction and a horizontal scanning circuit composed of plural unit circuit stages arranged in the horizontal direction, for selecting and reading said plural light receiving areas in succession and in which said vertical scanning circuit and said horizontal scanning circuit are arranged in spaces between said light receiving areas, wherein a crossing area of said vertical scanning circuit and said horizontal scanning circuit, in a space between said light receiving areas, is divided into two areas, and at least a unit circuit of said horizontal scanning circuit is provided in one of said two areas while at least a unit circuit of said vertical scanning circuit is provided in the other of said two areas.

2. An image pickup apparatus according to claim 1, wherein two unit circuits of said horizontal scanning circuit are provided in said one of said two areas in which said horizontal scanning circuit is provided, or two unit circuits of said vertical scanning circuit are provided in said other of said two areas in which said vertical scanning circuit is provided.

3. An image pickup apparatus according to claim 1, wherein different wiring layers are used for the vertical scanning circuit of said plural stages and the horizontal scanning circuit of said plural stage, and the length of wiring in each wiring layer remains unchanged in a crossing area of the vertical scanning circuit of said plural stages and the horizontal scanning circuit of said plural stages.

4. A radiation image pickup apparatus comprising an image pickup apparatus according to claim 1, a scintillator plate, and a fiber optics plate.

5. A radiation image pickup system comprising:
a radiation image pickup apparatus comprising an image pickup apparatus according to claim 1, a scintillator plate, and a fiber optics plate,
signal processing means for processing a signal from said radiation image pickup apparatus;
recording means for recording a signal from said signal processing means;
display means for displaying the signal from said signal processing means;
transmission process means for transmitting the signal from said signal processing means; and
a radiation source for generating said radiation.

* * * * *

UNITED STATES PATENT AND TRADEMARK OFFICE
CERTIFICATE OF CORRECTION

PATENT NO. : 7,138,696 B2  Page 1 of 1
APPLICATION NO. : 10/270651
DATED : November 21, 2006
INVENTOR(S) : Tomoyuki Noda It is certified that error appears in the above-identified patent and that said Letters Patent is hereby corrected as shown below:

COLUMN 7:
Line 50, "same" should read -- the same --.

COLUMN 10:
Line 24, "at" should be deleted.

COLUMN 12:
Line 22, "stage," should read -- stages, --.

Signed and Sealed this

Third Day of July, 2007

JON W. DUDAS
*Director of the United States Patent and Trademark Office*